(12) United States Patent
Walitzki (10) Patent No.: US 6,979,630 B2
(45) Date of Patent: Dec. 27, 2005

(54) METHOD AND APPARATUS FOR TRANSFERRING A THIN LAYER OF SEMICONDUCTOR MATERIAL

(75) Inventor: Hans J. Walitzki, Portland, OR (US)

(73) Assignee: Isonics Corporation, Golden, CO (US)

( * ) Notice: Subject to any disclaimer, the term of this patent is extended or adjusted under 35 U.S.C. 154(b) by 0 days.

(21) Appl. No.: 10/638,285

(22) Filed: Aug. 7, 2003

(65) Prior Publication Data

US 2004/0171196 A1  Sep. 2, 2004

Related U.S. Application Data

(60) Provisional application No. 60/402,326, filed on Aug. 8, 2002.

(51) Int. Cl.$^7$ .............................. H01L 21/30
(52) U.S. Cl. ............. 438/459; 438/473; 438/526
(58) Field of Search ................ 438/455, 459, 438/471, 473, 526

(56) References Cited

U.S. PATENT DOCUMENTS

| | | | | |
|---|---|---|---|---|
| 5,374,564 A | * | 12/1994 | Bruel | 438/455 |
| 6,020,252 A | * | 2/2000 | Aspar et al. | 438/459 |
| 6,146,979 A | * | 11/2000 | Henley et al. | 438/458 |
| 6,221,738 B1 | * | 4/2001 | Sakaguchi et al. | 438/458 |
| 6,368,938 B1 | * | 4/2002 | Usenko | 438/475 |

* cited by examiner

*Primary Examiner*—Chandra Chaudhari
(74) *Attorney, Agent, or Firm*—Sheridan Ross P.C.

(57) ABSTRACT

The present invention provides a method and apparatus for lift-off of a thin layer from a crystalline substrate, preferably the layer from a silicon wafer to further form a silicon-on-insulator (SOI) sandwich structure, wherein a separation layer is formed inside a donor wafer by trapping hydrogen into a preformed, buried defect-rich layer preferably obtained by implanting a low dose of light ions through a protective layer deeply into this donor wafer. The donor wafer is then bonded to a second wafer and then split at the separation layer using a splicing apparatus. The invention also provides a "Wide Area Ion Source" (WAIS) that performs both implants in a very cost effective manner.

11 Claims, 13 Drawing Sheets

METHOD AND APPARATUS FOR TRANSFERRING A THIN LAYER OF SEMICONDUCTOR MATERIAL

CROSS-REFERENCE TO RELATED APPLICATIONS

This application claims benefit under 35 USC § 119(e) of U.S. Provisional Application No. 60/402,326, filed Aug. 8, 2002, which is incorporated herein in its entirety by this reference.

FIELD OF THE INVENTION

The present invention provides methods and devices for performing implantation steps in fabricating silicon-on-insulator wafers or silicon on silicon wafers.

BACKGROUND OF THE INVENTION

Normally, semiconductor device functions are only performed in a very shallow region on the front surface of silicon wafers, the bulk of the silicon wafer serving only as a mechanical carrier. For more demanding semiconductor applications, such as complex integrated circuits including microprocessors, thin-film silicon-on-insulator (SOI) technology has been established that electrically isolates the thinner active device layer from the bulk of the silicon wafer.

Most methods for making such thin film SOI wafers rely on the relatively slow and expensive processes of ion-implantation. One of the oldest of these implantation methods implants a high dose of oxygen ions into a silicon wafer and then transforms this oxygen into an internal quartz ($SiO_2$) layer by a series of high temperature anneals at temperatures close to the melting point of silicon. Beyond the drawback of relatively high cost, this method also results in reduced crystalline quality as a result of the high dose implantation and the extended high temperature anneals, both of which introduce crystalline defects and contamination into the active device region.

It is well known that the introduction of hydrogen into a metal causes embrittlement and breakage due to the formation of internal hydrogen micro-bubbles. Similarly, if hydrogen is implanted into a silicon wafer, it can be collapsed by specific heat treatments into an internal micro-bubble layer. This methodology has been used to produce thin film wafers as described in U.S. Pat. No. 5,374,564 to Bruel. In this process, hydrogen ions are implanted into a silicon wafer, and, after bonding this implanted wafer to another wafer, the implanted wafer is separated at the internal bubble layer, leaving a thin film of silicon firmly bonded to the second wafer. The implanted wafer may then be polished and cleaned and thus be reused for another cycle. A major drawback of this method is the cost of using ion-beam implanters to deposit the required dose of hydrogen ions into a well-defined depth underneath the surface. Additionally, the wafer has to be kept cool during implantation to avoid premature blistering caused by formation of micro-bubbles already present in the wafer. These drawbacks have limited the usefulness of this thin film production methodology.

Plasma immersion ion implantation has been used in an attempt to reduce the high costs of ion-beam implantation as described in U.S. Pat. No. 6,146,979 to Henley et al. Unfortunately, plasma immersion implantation results in a wide energy distribution of incident hydrogen ions resulting in a broader zone in which the implanted hydrogen comes to rest. This typically necessitates about a ten-fold increase in the minimum implant dose of hydrogen ions which damages the thin wafer layer to be lifted off the surface of that wafer resulting in a final SOI wafer of lower quality than wafers obtained using the process described by Bruel. Additionally, any unwanted elements present in the plasma generator will also become implanted contaminants in the wafer. Because of the lower yield and the reduced quality of the final product caused by these problems, the plasma immersion process was replaced with another process that uses multiple epitaxially-grown layers in conjunction with a low dose hydrogen implant.

A further attempt to reduce the cost of ion implantation is described in U.S. Pat. No. 6,368,938 to Usenko et al. This method combines a low dose ion beam implantation process with a second hydrogen diffusion step wherein the implantation damage created in the first step getters the hydrogen from the second step. The hydrogen for the diffusion step is provided from an electrolytic cell. This second step, however, is difficult to control and can take a long time to reach saturation. For these reasons, this process has not been used for large-scale commercial production of SOI wafers.

All of the present ion-implantation based processes are very expensive due to the use of sophisticated ion beam implanters. The dose requirements and the limitations on beam current require long process times such that the cost of this process step alone can be a multiple of the cost of a regular substrate.

Therefore, there is a need for new methods of producing thin layer semiconductors in which the lift-off of surface films is achieved with lower costs while maintaining or improving the crystalline quality of the product.

SUMMARY OF THE INVENTION

The present invention provides a method and apparatus for lift-off of a thin layer from a crystalline substrate, preferably the layer from a silicon wafer to further form a silicon-on-insulator (SOI) sandwich structure, wherein a separation layer is formed inside a donor wafer by trapping hydrogen into a pre-formed, buried defect-rich layer preferably obtained by implanting a low dose of light ions through a protective layer deeply into this donor wafer. The hydrogen is preferably inserted into the substrate by a second, shallow implantation into the protective layer and then diffused through the donor wafer to be trapped at the gettering sites prepared by the first, deep implant. The invention also provides a "Wide Area Ion Source" (WAIS) that performs both implants in a very cost effective manner. The donor wafer is then bonded to a second wafer and then split at the separation layer using a splicing apparatus that is also disclosed.

DETAILED DESCRIPTION OF THE INVENTION

In one embodiment of the invention, a newly designed "Wide-Area-Ion-Source" (WAIS) is used to create an ion plasma over an area that is typically larger than the semiconductor substrate. Preferably, for larger cost savings, a multitude of substrates is placed on a holder that is exposed to the WAIS so that a group of wafers can be treated simultaneously. This requires that the WAIS is as large or larger than the substrate holder.

Figure 1:
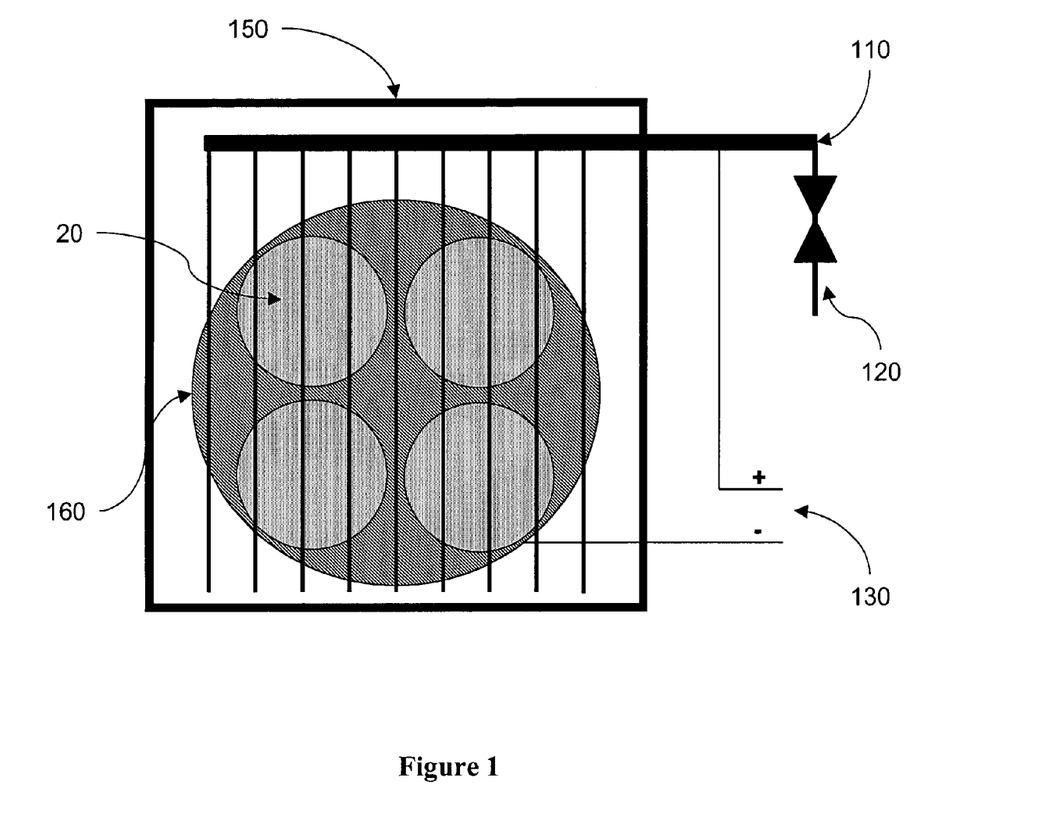
FIG. 1 illustrates the design of a wide area ion source (WAIS) as seen from above.

As shown in FIG. 1, the wide area ion source (WAIS) consists of a multitude of plasma jet beams arranged in a a gas manifold (110), which is supplied with a feed gas through a mass flow control valve (120).

The plasma is generated from a feed gas, which contains the desired element and, optionally, a carrier gas. Coaxially-mounted permanent magnets enhance the ion generation efficiency by creating multiple electron cyclotron resonance spots along the high frequency feed to a coaxial wire. Each beam is as long as the vacuum chamber for the substrate holder and the spacing between the beams is approximately as wide as the gaps between each jet on each beam. This beam assembly is fed from a central gas manifold so that the element that makes the desired ions can be changed simultaneously.

The gas manifold and the substrate holder (160) are electrically isolated from each other and the vacuum chamber so that a high voltage potential, provided by power supply (130) can be applied such that ions in the plasma jet beams can be accelerated and implanted into a substrate with high energy by application of a suitable voltage between substrate and manifold. The plasma jets created by the source can provide ions at a high energy for a deep implant into the wafer or at low energy for shallow implant into the protective layer. Additionally, by changing the feed gas, the plasma jets can be used to etch the substrate to remove surface contamination and films, or deposit additional films, if so desired. The substrate holder can hold a multitude of wafers (20).

Figure 2:
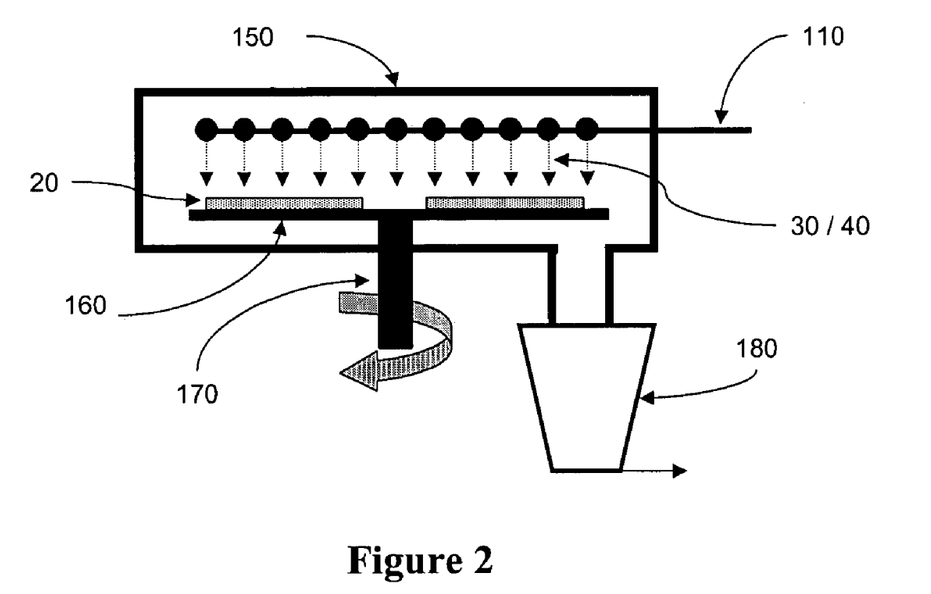
FIG. 2 shows the WAIS from the side.

A view from the side of the WAIS is shown in FIG. 2. The chamber (150) is evacuated by a suitable pump (180). Inside, the substrate holder (160) is rotated or oscillated by a shaft (170) to homogenize the exposure of the wafers (20) to the plasma ion jets, which can be of high energy (30) or low energy (40), depending on the voltage potential applied between gas manifold (110) and substrate holder.

Figure 3:
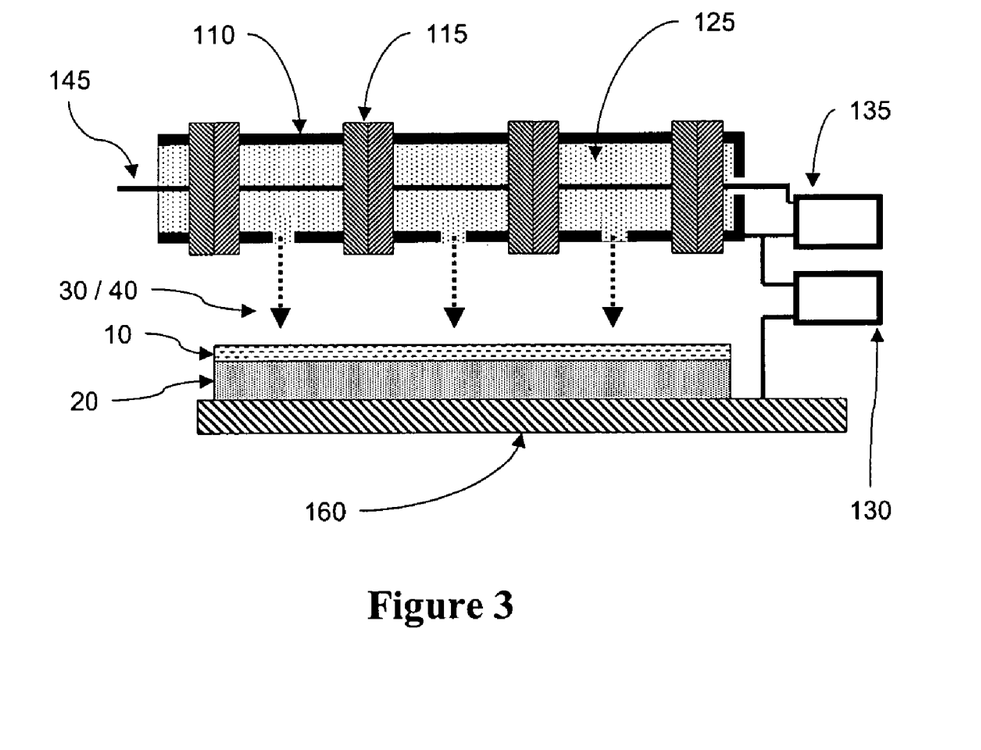
FIG. 3 illustrates the principal construction of the ion source.

The principal construction of the ion source is shown in FIG. 3. It consists of the gas manifold tubes (110) with a concentric wire (145), which is connected to a high-frequency generator (135) to form a plasma (125) from the feed gas. This tube also carries ring magnets (115), equally spaced between small equidistant orifices through which the plasma ions can exit as jets into the space between the manifold and the substrate holder (160). The electrical potential provided by the DC power source (130) will then accelerate these ions towards the protective layer (10) covering the wafer (20).

Compared to ion beam implanters, this system is much simpler, easier to operate and much more productive for achieving implantation doses required for the separation of a thin layer ($10^{15}$–$10^{17}$ ions/cm$^2$). Additionally, mass separation to select a particular element from a multitude of ions emerging from the ion source is not required by this process which is a key element to make a WAIS technically feasible.

During the high-energy step of the process of this invention, any unwanted heavy ions are stopped within a protective layer on top of the substrate while light elements easily penetrate this layer and come to rest in a certain depth under the oxide layer. The first implantation step is very brief, thereby reducing the risk that unwanted heavy elements enter the plasma source. The second, low energy step deposits a high dose of light ions into the protective layer. Any unwanted heavy ion is effectively stopped very close to the surface of the protective layer.

In this method, the WAIS serves at least two, and potentially three functions. First, the WAIS provides a low dose of light ions to be deposited at a certain depth under the surface and under the sacrificial oxide layer, creating implantation damage that is more concentrated at the end of the flight path of the implanted ions. In this mode, the ion source is kept at a high potential during the implantation step to provide kinetic energy for the ions to penetrate deeply into the substrate.

Second the WAIS provides a high concentration of a light element that diffuses fast into the substrate material at relatively low temperatures to be trapped (gettered) by the damage created by first element or by the element itself or a combination of both. In this embodiment of the process, the ion source is kept at a low potential to deposit the ions in a shallow layer within the protective oxide layer. This also reduces any contamination of the substrate by undesired ions.

Third, optionally, the WAIS serves to remove the protective layer on the substrate surface by creating a plasma from a third element that etches the material of the protective layer and thus removes all surface contamination.

Figure 4:
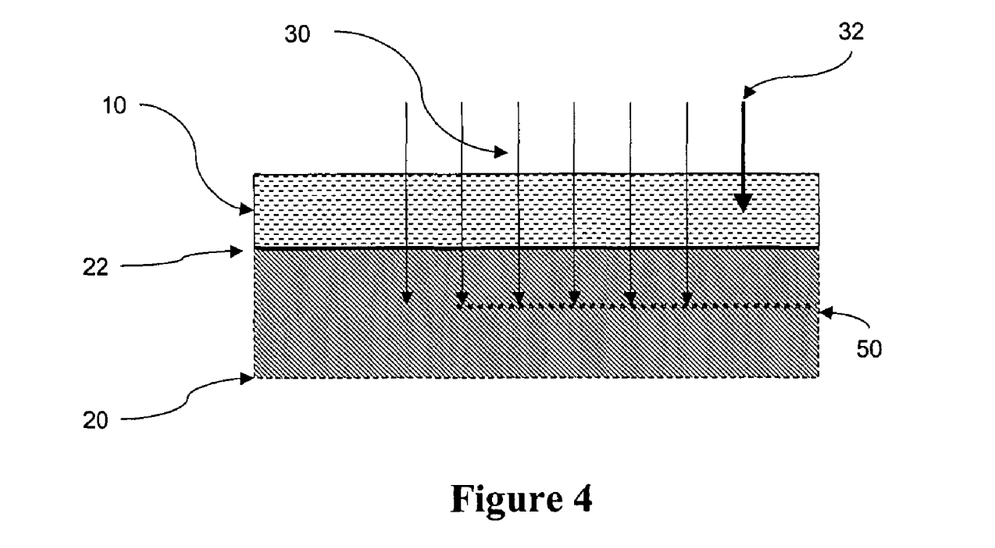
FIG. 4 shows a cross-section through the side of a wafer (20) close to the polished surface (22) that is covered by a thin protective layer (10) during the first implantation step.

Referring to FIG. 4, the substrate (20) is covered with a thin protective layer (10), preferably an SiO$_2$ layer which is thermally grown or deposited in a CVD or sputter process. Alternatively, a thin organic film (such as a photo resist layer) or a combination of any of these layers is applied to the surface of the substrate. The purpose of the protective layer is to protect the substrate surface during the process and the protective layer is removed in the latter steps of the process. The protective layer is SiO$_2$, Photo-Resist, a thin metallic film or a combination of any of these materials. The thickness of the protective layer applied is smaller than the average penetration depth of the implanted ions.

In a first, deep implantation step, a low dose of light, high-energy ions (30) is deposited through the protective layer to a depth (50) underneath the first layer. The substrate temperature is kept low enough to prevent excessive self-annealing during this process. During this step, heavy ions (32) of the same energy, due to their mass and size, will not penetrate the protective layer (10). In this deep implantation step, the applied potential is in the range of about 20 kV to about 500 kV, and preferably between about 50 kV and about 200 kV if the the substrate is a silicon wafer. The ion plasma density is controlled in such manner that the dose of ions deposited into the substrate is not less than about $10^{13}$ but no more than about $10^{18}$ ions/cm$^2$ and preferably about $10^{15}$ ions/cm$^2$. The ions are selected from suitable light elements such as H, D, He, Li, B, Ne, or Si, such that the penetration depth is larger than the penetration depth of most other unwanted heavier elements that may be present in the ion source, and reach the surface with the same energy as the light elements. During this first implantation, the temperature of the substrate is kept between about −173° C. and about 527° C., and is preferably controlled to be between about 227° C. and about 327° C.

Figure 5:
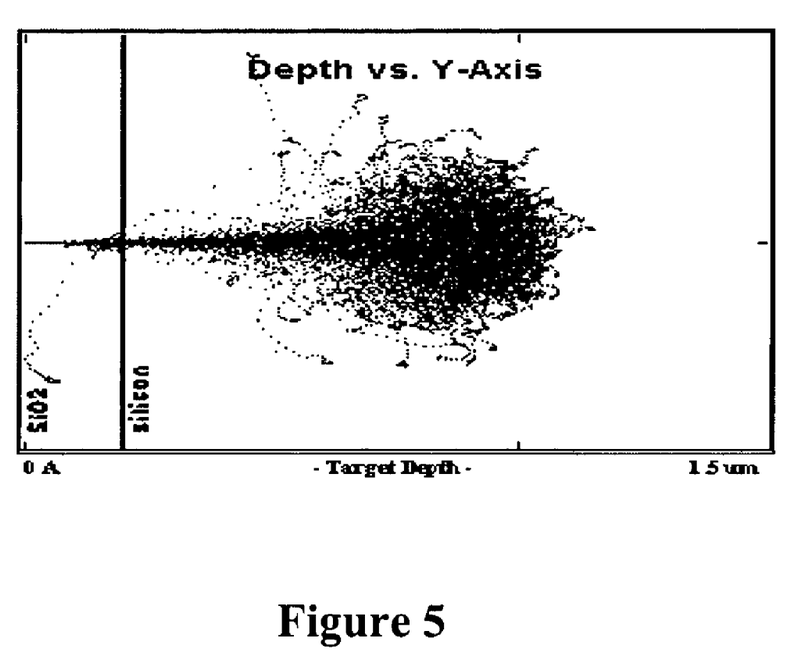
FIG. 5 illustrates the path and depth distribution of light ions through a protective layer made from thermally grown oxide ($SiO_2$).
Figure 6:
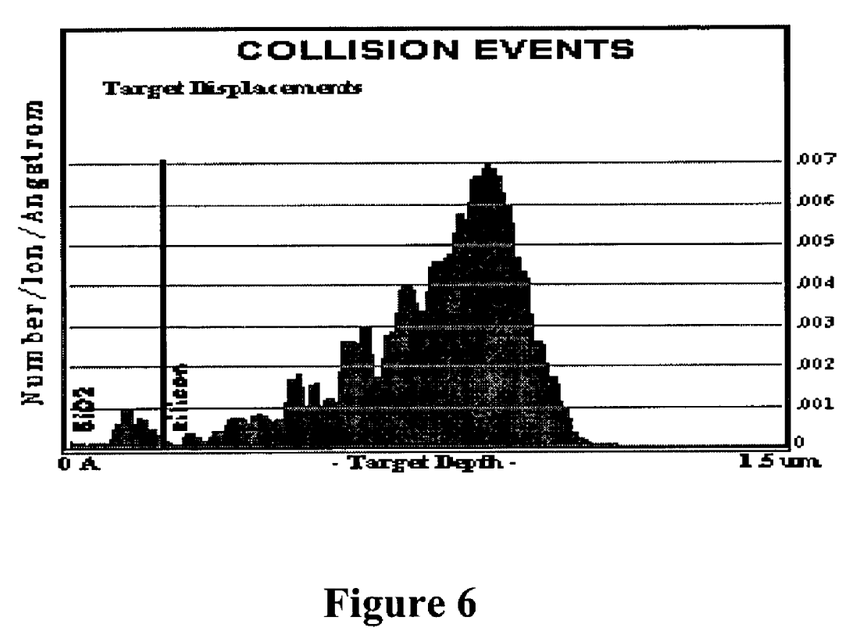
FIG. 6 illustrates the density of gettering sites created by the first implantation with a peak around 900 nm underneath the original surface of the silicon wafer.

The path and depth distribution of light ions (example H+) implanted with 100 keV energy through a 200 nm protective layer made from thermally grown oxide (SiO$_2$) is shown in FIG. 5. The majority of the implanted ions stop at about 900 nm depth underneath the original silicon wafer surface. FIG. 6 shows the density of gettering sites created by this first implantation step with a peak around 900 nm underneath the original surface of the silicon wafer.

Figure 7:
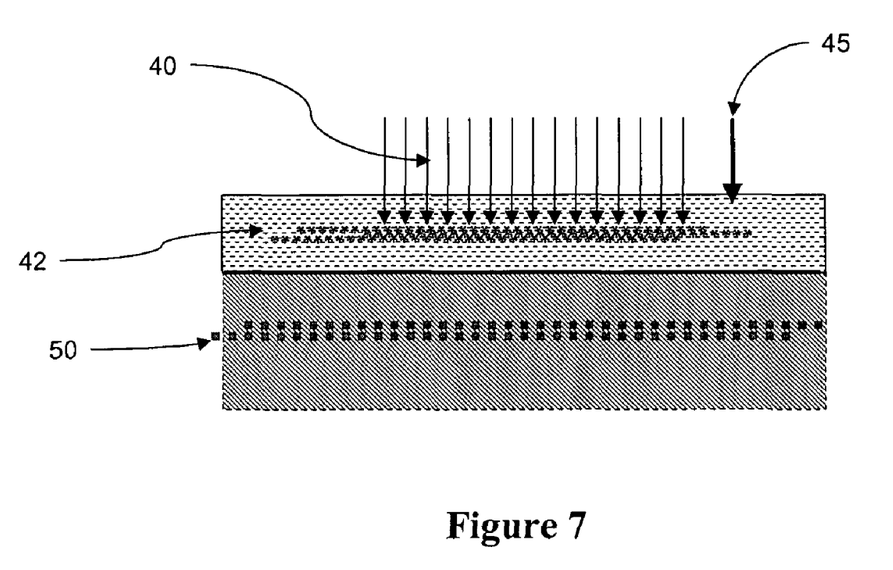
FIG. 7 shows a cross-section through the same wafer during the second, shallow implantation step.

In a second, shallow implant step, illustrated in FIG. 7, a higher dose of light ions (40) is deposited at low energy into the protective layer. Due to the lower energy, the lighter ions (40) are also stopped within the protective layer at a depth indicated by lines (45). Heavier ions (42) are stopped very close to the surface of the protective layer. This keeps the crystalline damage in the substrate at a minimum and also prevents any contamination from getting into the substrate. In this second implantation stage, the potential of the ion source is reduced to a very small potential with respect to the substrate, and the element supplied to the plasma source is optionally switched to a second element which is preferably hydrogen or deuterium. The energy of these ions is adjusted by reduction of the potential applied such that they are stopped within the protective layer. The implantation dose is kept high to provide an excess of hydrogen for diffusion into the donor wafer and capture by the gettering sites provided by first implantation step. During this shallow implant step, the substrate is kept at a temperature between about 27° C. and about 527° C. and preferably between about 227° C. and about 327° C. such that the damage to the crystalline structure caused by deposition of the first element remains to a large degree, and can act as trap for the second implanted element while the diffusion of the second ions is fast enough to achieve economically feasible throughput.

Figure 8:
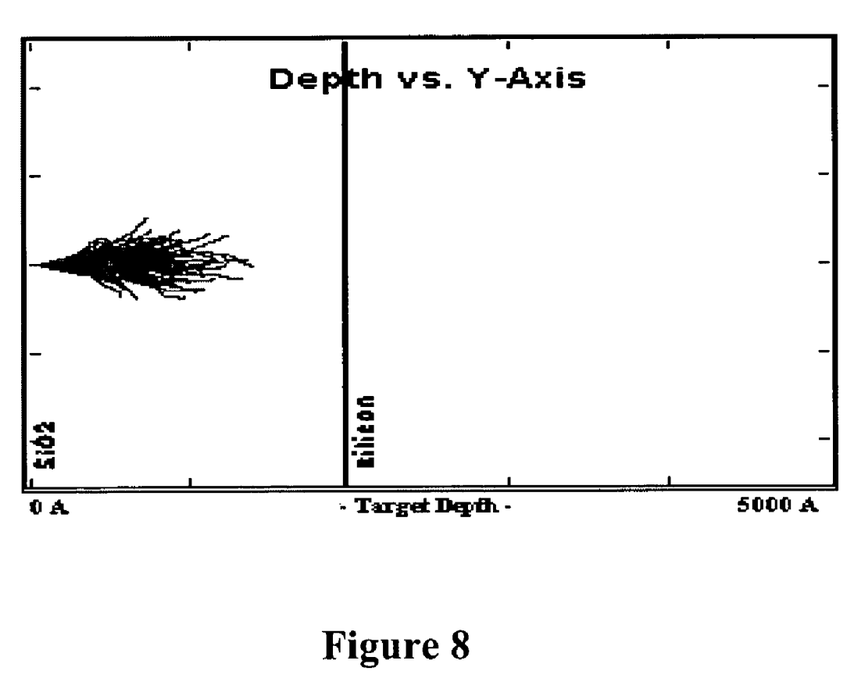
FIG. 8 illustrates the path and depth distribution of heavy ions into the same wafer during the 100 keV implantation.
Figure 9:
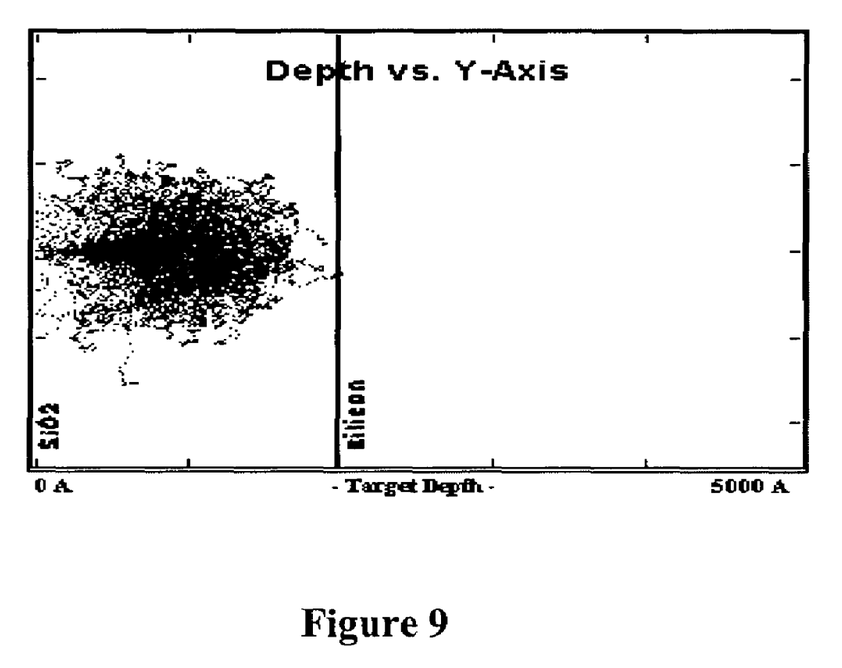
FIG. 9 shows the path and depth distribution of light ions during the second, low energy shallow implantation.

The path and depth distribution of heavy ions into the same wafer during the 100 keV implantation is shown in FIG. 8. These heavy ions are entirely contained by the protective layer. FIG. 9 shows the path and depth distribution of light ions (example H+) during this second, low energy, shallow implantation. By comparison with FIG. 5, these light ions are entirely contained by the protective layer during this second step such that no damage is done to the silicon wafer.

During this second step of the procedure, the substrate temperature is kept at a level that provides a reasonable speed for diffusion of this second species throughout the substrate until it is absorbed by a trap created during the first implantation. This diffusion may occur in-situ during the high dose—low energy step or outside the WAIS tool in a separate annealing oven.

Figure 10:
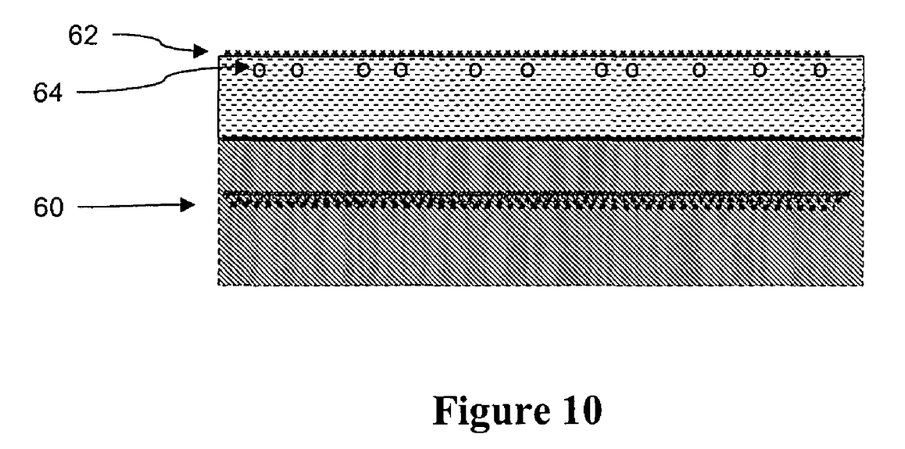
FIG. 10 illustrates the wafer of FIG. 2 after an annealing step diffusing the implanted light ions from the shallow implantation step throughout the wafer.

FIG. 10 illustrates the same wafer after an annealing step diffusing the implanted light ions from the shallow implantation step throughout the wafer. While some ions effuse from the surface (62) and are lost, a majority are trapped by the damage (60) caused by the first, deep implant. Due to the slow diffusion rate of most heavy elements, any unwanted heavy element contamination remains within the protective layer as indicated (64).

The order of the first and second implantation step may be reversed.

Following the implantation steps, the protective layer is removed or reduced in thickness by chemical etching or by switching the WAIS to a plasma etch mode in which another element (or a mixture of elements) is used that are known to selectively etch the material of the protective layer but not the substrate material underneath. In doing so, all unwanted contamination and implantation damage contained in the protective layer is removed.

The substrate may then be cleaned and bonded to a second substrate to build a composite structure. The bonding strength of the composite structure is increased by annealing at a temperature between about 127° C. and about 327° C. as a first step followed by annealing at a temperature between about 427° C. and about 527° C. as a second step, which will form an internal, hydrogen rich layer at a depth determined by the deposition of first element and which is mechanically weakened by the second element such that the composite structure can be separated at this layer by adding an small amount of energy from thermal or mechanical stress, sound waves, infra-red radiation or other suitable means.

Figure 11:
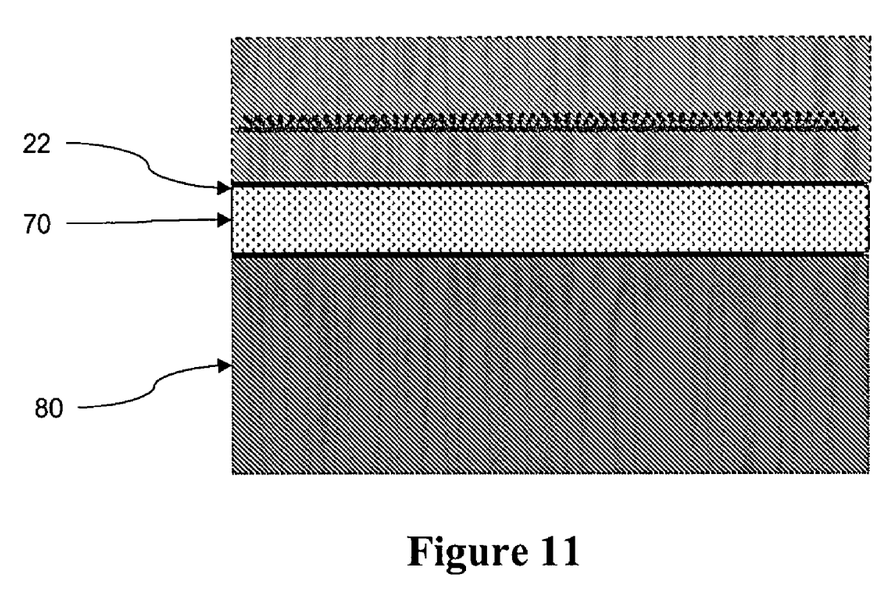
FIG. 11 shows the original front side (22) of the first wafer attached to a second wafer (80) that is covered with an isolating layer (70) to form an SOI wafer.

This bonding is illustrated in FIG. 11 which shows the original front side (22) of the first wafer attached to a second wafer (80) that is covered with an isolating layer (70) to form an SOI wafer. In this figure, the protective layer has been removed prior to attaching the two wafers. This second substrate may be covered by a thin film of insulating material (if a silicon-on-insulator structure is the desired final product), or a multitude of layers including diamond or other materials that improve the lateral distribution of heat from the device functions. This substrate may also be made from other materials including quartz, glass, poly-crystalline silicon and a silicon wafer with no oxide cover.

Figure 12:
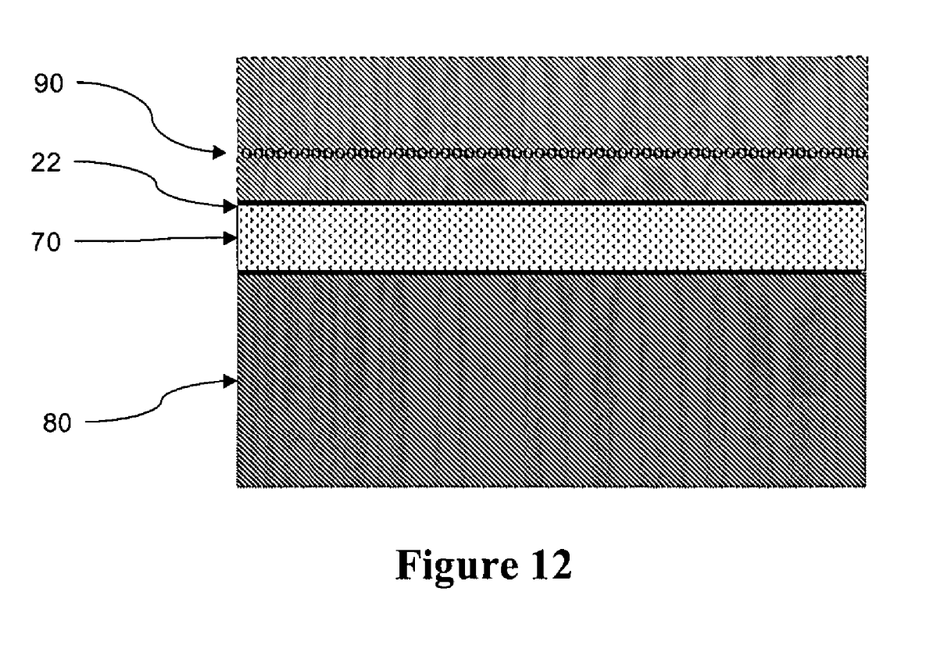
FIG. 12 shows the bond between the two wafers at the interface (22) is strengthened by a brief low temperature anneal.
Figure 13:
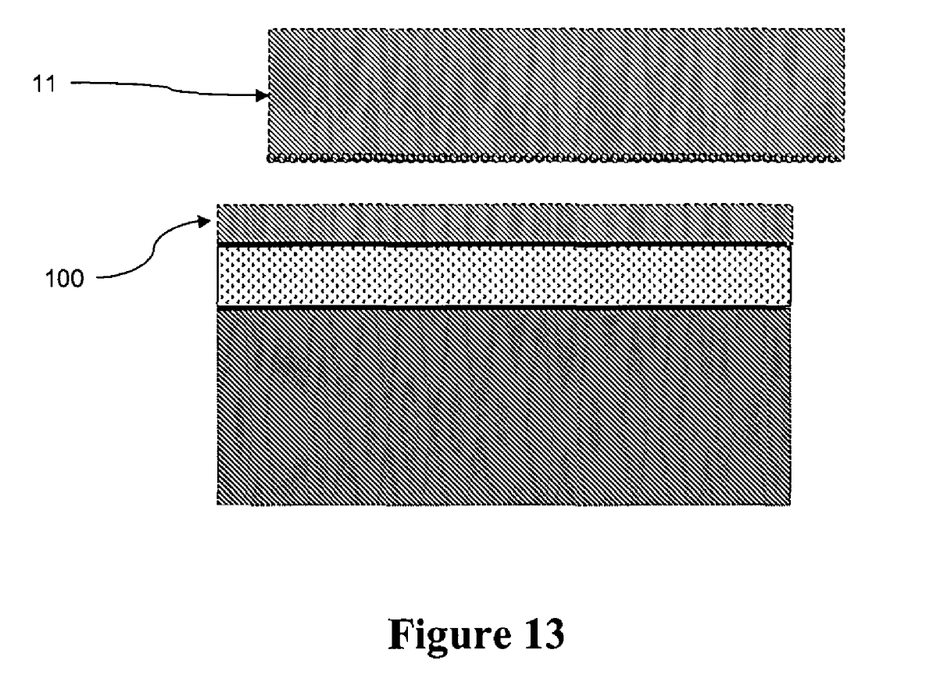
FIG. 13 shows the situation after applying some force to splice the implanted wafer at the plane defined by the first deep implant.

As shown in FIGS. 12 and 13, the bonded structure is then heat-treated at a temperature where the implanted and diffused elements coagulate and weaken the layer determined by the implantation depth of the first element such that application of an additional force splits the composite structure at the implantation depth. Referring to FIG. 12, the bond between the two wafers at the interface (22) is strengthened by a brief low-temperature anneal which also collapses the trapped light ions into micro-voids leading to an embrittlement of the implanted wafer at the plane (90) where the largest damage from the first deep implant occurred. FIG. 13 shows the situation after applying some force to splice the implanted wafer at the plane defined by the first deep implant. As a result, a thin film of material (100) remains on top of the handle wafer while the remainder of the implanted wafer (11) is removed.

The composite structure may be further heat treated to increase the strength of the bond between the transferred layer and the second substrate followed by an optional final polishing step to reduce the surface roughness. This further anneal is conducted at higher temperatures, preferably between about 727° C. and about 1127° C. for a time duration between about 30 minutes and several hours. The surface of this new structure may be smoothed by chemical mechanical polishing and cleaning in aqueous solutions of HF, alkaline and acidic chemicals followed by thorough rinsing and drying.

The remainder of the first substrate may be reused for another layer transfer after appropriate polishing and cleaning.

The preceding description provides preferred exemplary embodiments only, and is not intended to limit the scope, applicability or configuration of the invention. Rather, the ensuing description of the preferred exemplary embodiments will provide those skilled in the art with an enabling description for implementing a preferred exemplary embodiment of the invention. It should be understood that various changes might be made in the function and arrangement of elements without departing from the spirit and scope of the invention as set forth in the appended claims.

What is claimed is:

1. A method of forming a semiconductor wafer comprising:
   a. depositing a first charged ion made from a light element selected from the group consisting of H, D, He, Li, B, Ne, and Si under the surface of a first substrate wherein the first substrate is covered with a protective layer thinner than the average penetration depth of the ions, and wherein a source of the first charged ion is kept at an electrical potential with respect to the first substrate between 20 kV and 500 kV, and wherein the first charged ion is deposited into the substrate at a dosage between $10^{13}$ ions/cm$^2$ and $10^{18}$ ions/cm$^2$, and wherein the temperature of the first substrate is kept between −173° C. and 527° C.;
   b. implanting a second ion in the protective layer wherein the potential of a source of the second ion with respect to the substrate is lower than during the depositing step and wherein the temperature of the first substrate is kept between 27° C. and 527° C.;
   c. reducing the thickness of the protective layer;
   d. bonding the first substrate to a second substrate to form a composite structure;
   e. conducting a first annealing of the composite structure at a temperature between 127° C. and 327° C.;
   f. conducting a second annealing of the composite structure at a temperature between 427° C. and 527° C.;
   g. adding energy to the composite structure to separate the first and second substrates wherein the surface of the first substrate above the first charged ions remains attached to the second substrate after the separation of the first and second substrates to form a semiconductor wafer; and,
   h. finishing the surface of the semiconductor wafer.

2. The method of claim 1, wherein the finishing step comprises:
   a. annealing the semiconductor wafer at a temperature between 727° C. and 1127° C.;
   b. smoothing a surface of the semiconductor wafer by chemical mechanical polishing; and,
   c. cleaning the surface of the semiconductor wafer in an aqueous solution.

3. The method of claim 1, wherein the source of the first charged ion is kept at an electrical potential with respect to the first substrate between 50 kV and 200 kV.

4. The method of claim 1, wherein the first charged ion is deposited into the substrate at a dosage of about $10^{15}$ ions/cm$^2$.

5. The method of claim 1, wherein the temperature of the first substrate during the implanting step is between 227° C. and 327° C.

6. The method of claim 1, wherein the second ion is a hydrogen or deuterium ion.

7. The method of claim 1, wherein the protective layer is removed from the first substrate during the reducing step.

8. The method of claim 1, wherein the energy added to the composite structure in the adding step is selected from the group consisting of thermal stress, mechanical stress, sound waves, and infra-red radiation.

9. The process of claim 1, wherein the implanting step is conducted before the depositing step.

10. The process of claim 1, wherein said first charged ion is made from an element that is the same as elements comprising the semiconductor.

11. The process of claim 1, wherein the protective layer is selected from the group consisting of SiO$_2$, Photo-Resist, metallic film or a combination thereof.

* * * * *